(12) United States Patent
Tsai et al.

(10) Patent No.: US 12,315,806 B2
(45) Date of Patent: *May 27, 2025

(54) ELECTRONIC DEVICE AND MANUFACTURING METHOD THEREOF

(71) Applicant: Taiwan Semiconductor Manufacturing Company, Ltd., Hsinchu (TW)

(72) Inventors: Tsung-Fu Tsai, Changhua County (TW); Hou-Ju Huang, Hsinchu County (TW); Shih-Ting Lin, Taipei (TW); Szu-Wei Lu, Hsinchu (TW); Hung-Wei Tsai, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 95 days.

This patent is subject to a terminal disclaimer.

(21) Appl. No.: 18/306,989

(22) Filed: Apr. 25, 2023

(65) Prior Publication Data

US 2023/0260911 A1    Aug. 17, 2023

Related U.S. Application Data

(60) Continuation of application No. 17/120,298, filed on Dec. 14, 2020, now Pat. No. 11,670,593, which is a
(Continued)

(51) Int. Cl.
*H01L 23/532* (2006.01)
*H01L 21/48* (2006.01)
(Continued)

(52) U.S. Cl.
CPC .... *H01L 23/53204* (2013.01); *H01L 21/4857* (2013.01); *H01L 21/56* (2013.01); *H01L 23/29* (2013.01); *H01L 23/5383* (2013.01)

(58) Field of Classification Search
CPC .......... H01L 23/53204; H01L 21/4857; H01L 21/56; H01L 23/29; H01L 23/5383;
(Continued)

(56) References Cited

U.S. PATENT DOCUMENTS 9,000,584 B2   4/2015   Lin et al.
9,048,222 B2   6/2015   Hung et al.
(Continued)

FOREIGN PATENT DOCUMENTS

CN   101944496   1/2011
CN   103915413   7/2014
(Continued)

OTHER PUBLICATIONS

"Office Action of China Counterpart Application", issued on Aug. 15, 2024, p. 1-p. 8.

*Primary Examiner* — Britt D Hanley
*Assistant Examiner* — Vicki B. Booker
(74) *Attorney, Agent, or Firm* — JCIPRNET

(57) ABSTRACT

A semiconductor device includes a semiconductor die and a conductive structure disposed side-by-side and spaced apart from each other through an insulating encapsulant. The conductive structure includes a first conductor laterally covered by the insulating encapsulant, and a second conductor disposed over and separating from the first conductor. The second conductor includes a first portion laterally covered by the insulating encapsulant and a second portion protruded from the insulating encapsulant, where a ratio of a first standoff height of the first portion and a second standoff height of the second portion ranges from about 0.4 to about 1.5.

20 Claims, 16 Drawing Sheets

Related U.S. Application Data division of application No. 16/134,966, filed on Sep. 19, 2018, now Pat. No. 10,867,919.

(51) Int. Cl.
  *H01L 21/56* (2006.01)
  *H01L 23/29* (2006.01)
  *H01L 23/538* (2006.01)

(58) Field of Classification Search
  CPC . H01L 2221/68345; H01L 2221/68359; H01L 2224/04105; H01L 2224/12105; H01L 2225/1035; H01L 2225/1058; H01L 2225/1082; H01L 2924/15311; H01L 2924/18162; H01L 21/4853; H01L 21/6835; H01L 23/3128; H01L 23/49811; H01L 23/5389; H01L 23/49816; H01L 23/3107; H01L 24/19; H01L 24/02; H01L 24/03; H01L 24/05; H01L 25/105; H01L 25/50; H01L 2224/02379; H01L 2224/0401; H01L 2224/0502
  See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2008/0315385 A1* | 12/2008 | Gerber | H01L 21/565 257/E21.511 |
| 2014/0077369 A1* | 3/2014 | Liang | H01L 23/49827 257/738 |
| 2014/0124937 A1* | 5/2014 | Wu | H01L 24/81 257/772 |
| 2017/0110427 A1 | 4/2017 | Su | |

FOREIGN PATENT DOCUMENTS

| | | |
|---|---|---|
| TW | 201834086 | 9/2018 |
| WO | 2017052605 | 3/2017 |

* cited by examiner

ELECTRONIC DEVICE AND MANUFACTURING METHOD THEREOF

CROSS-REFERENCE TO RELATED APPLICATION

This application is a continuation application of and claims the priority benefit of a prior application Ser. No. 17/120,298, filed on Dec. 14, 2020. The prior application Ser. No. 17/120,298 is a divisional application of and claims the priority benefit of a prior application Ser. No. 16/134,966, filed on Sep. 19, 2018. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. Thus, packages such as wafer level packaging (WLP) have begun to be developed, in which integrated circuits (ICs) are placed on a carrier having connectors for making connection to the ICs and other electrical components. In an attempt to further increase circuit density, some package-on-package (POP) structures including an integrated fan-out package and at least one memory device stacked over the integrated fan-out package are developed and are becoming increasingly popular for their compactness. As the demand for miniaturization, higher speed and greater bandwidth, as well as lower power consumption and latency has grown recently, there has grown a need for smaller and more creative packaging techniques of POP structures.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
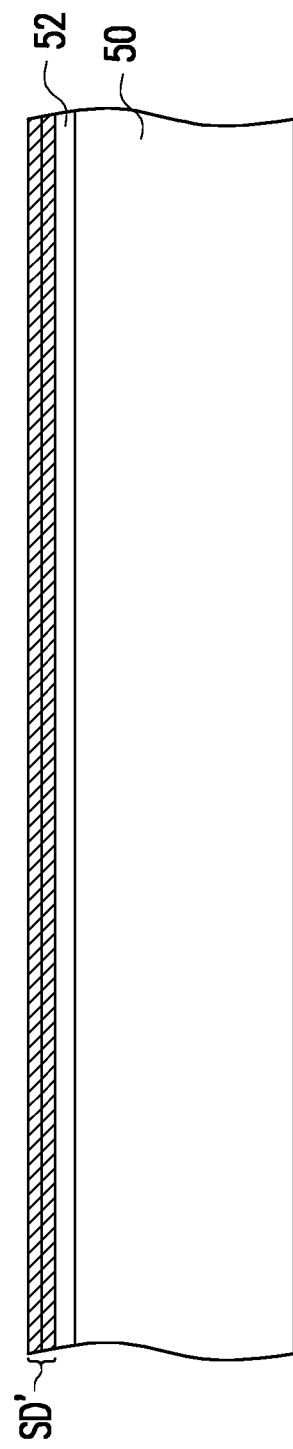
FIG. 1A to FIG. 1N are schematic cross sectional views of various stages in a manufacturing method of an electronic device according to some exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
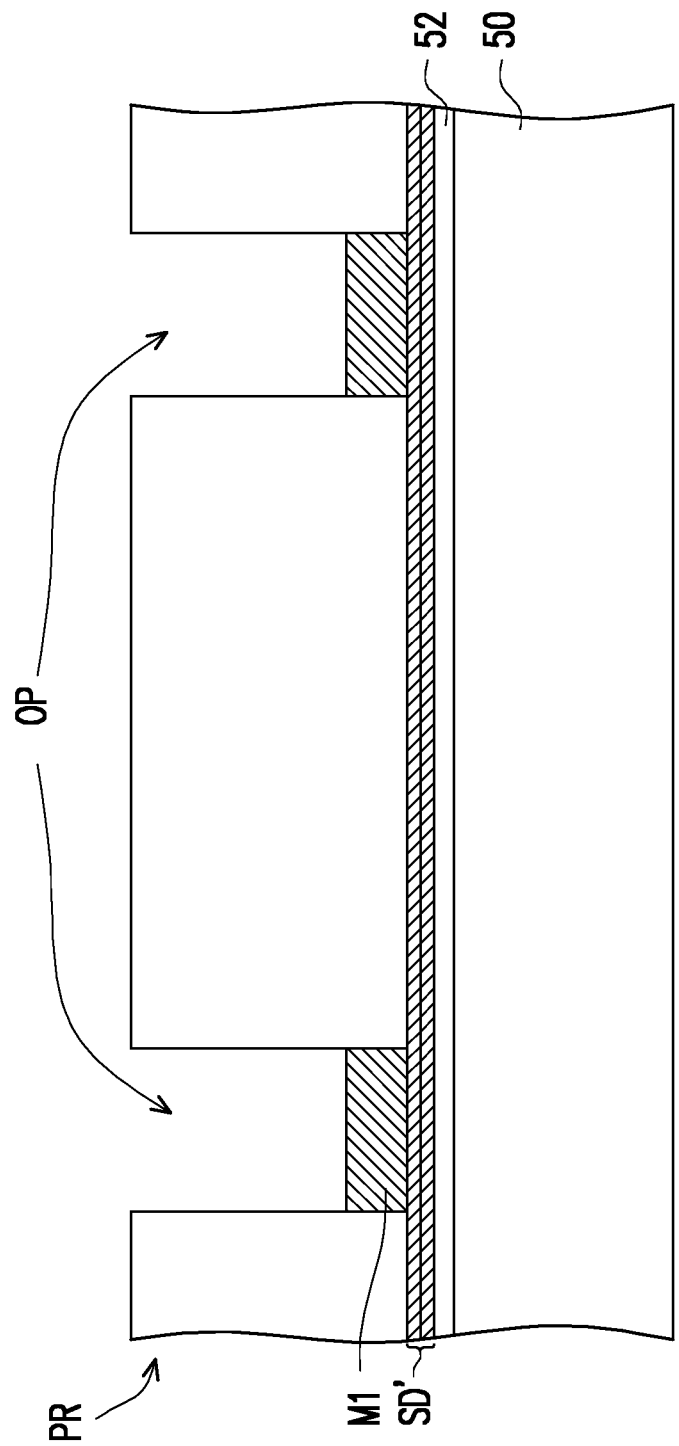
Figure 1C:
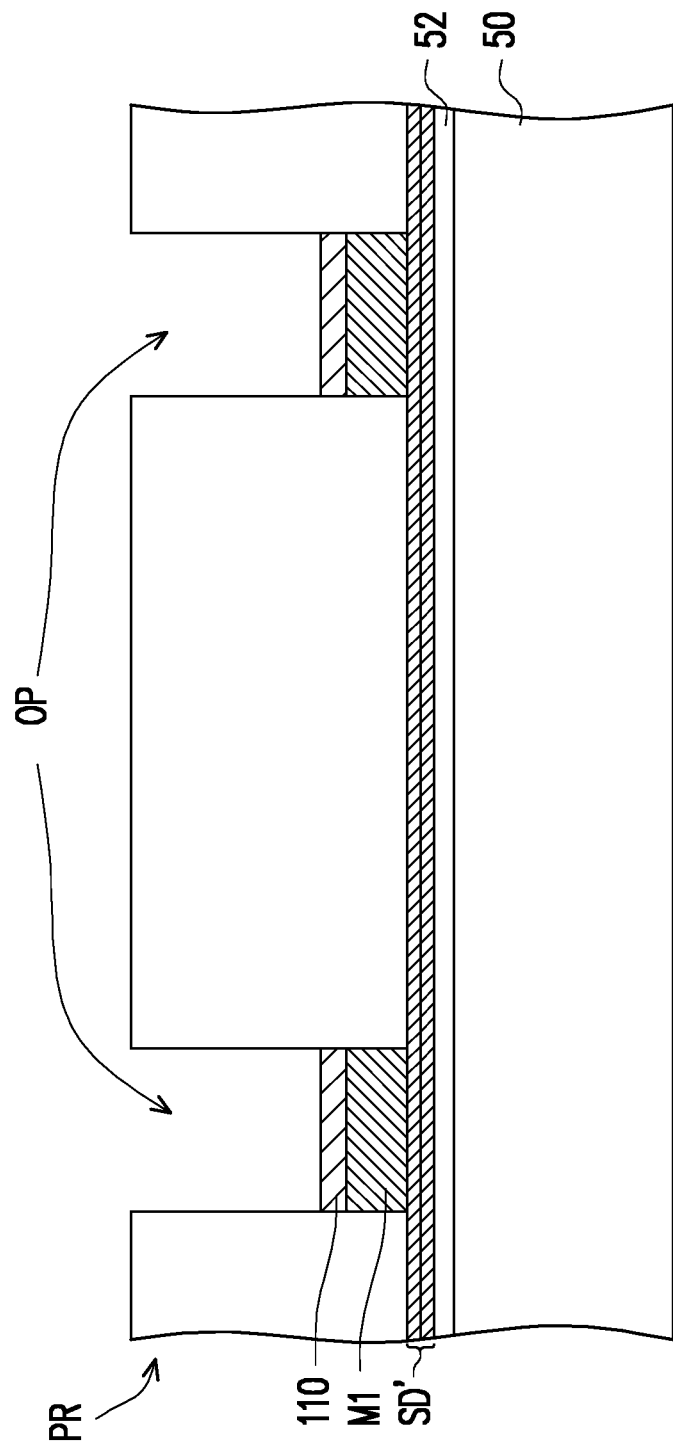
Figure 1D:
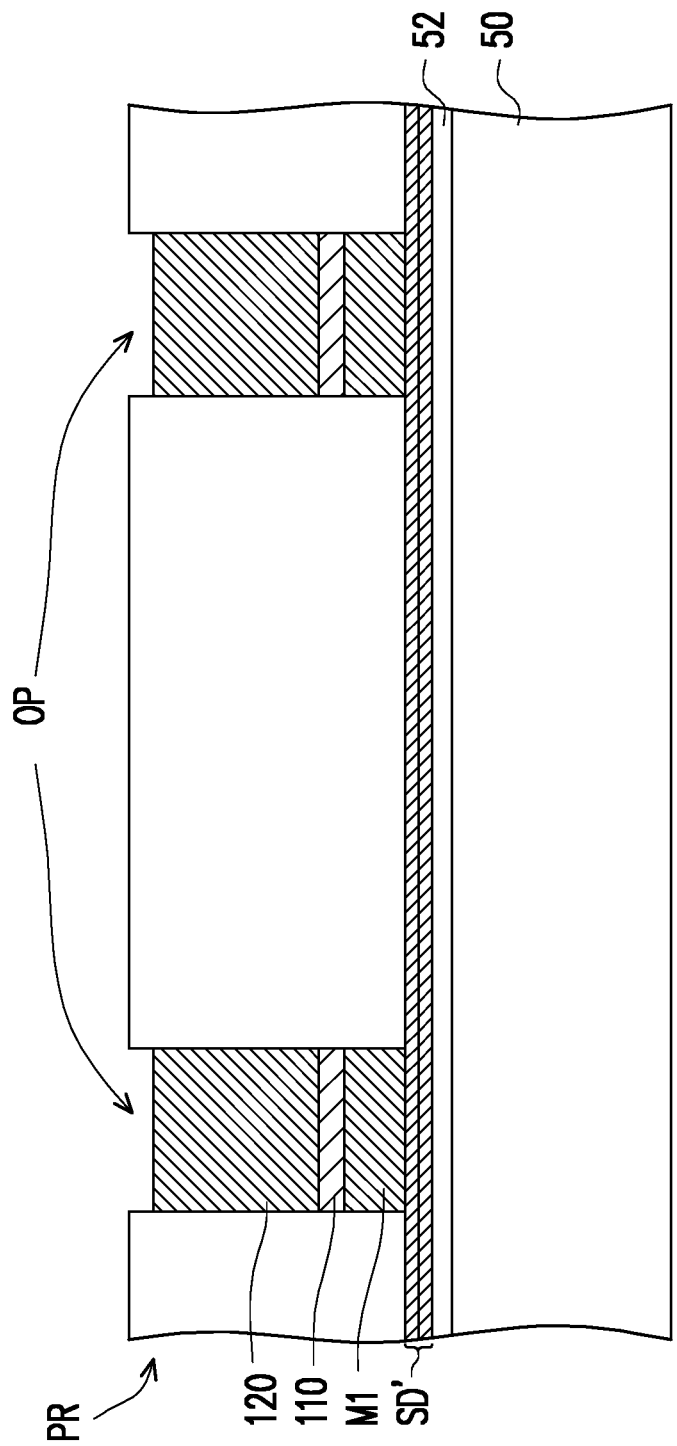
Figure 1E:
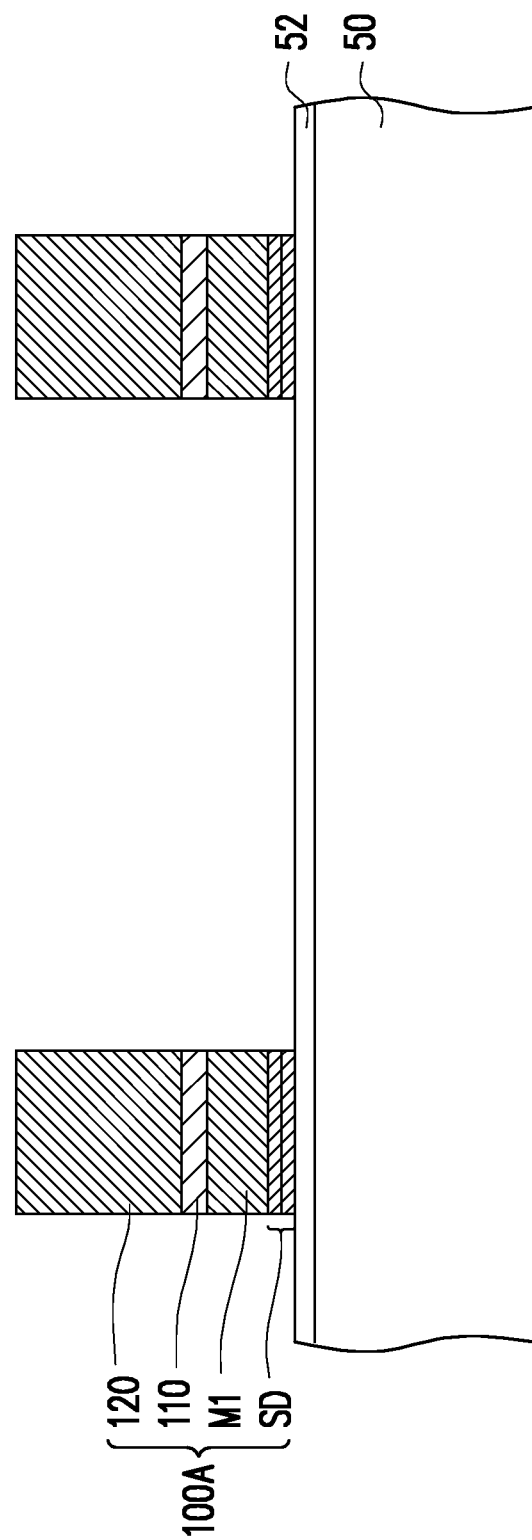
Figure 1F:
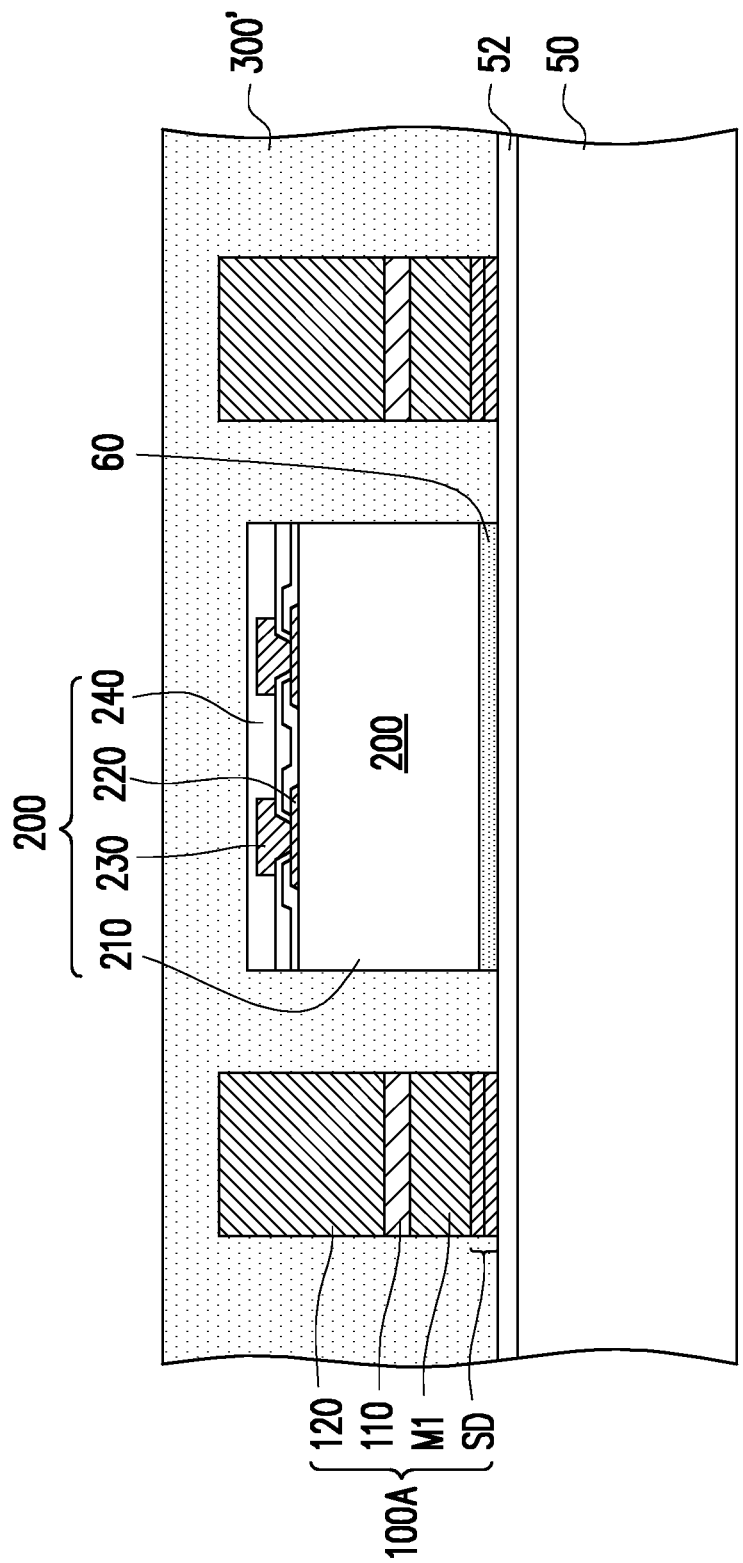
Figure 1G:
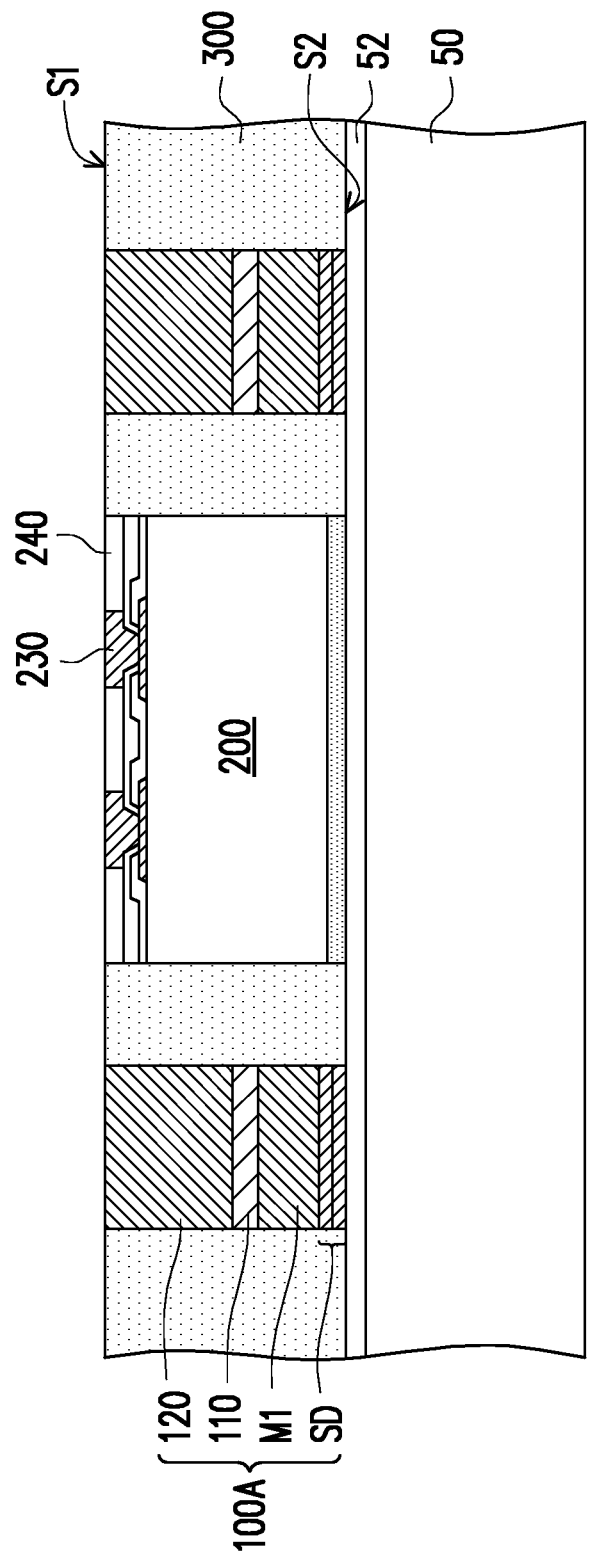
Figure 1H:
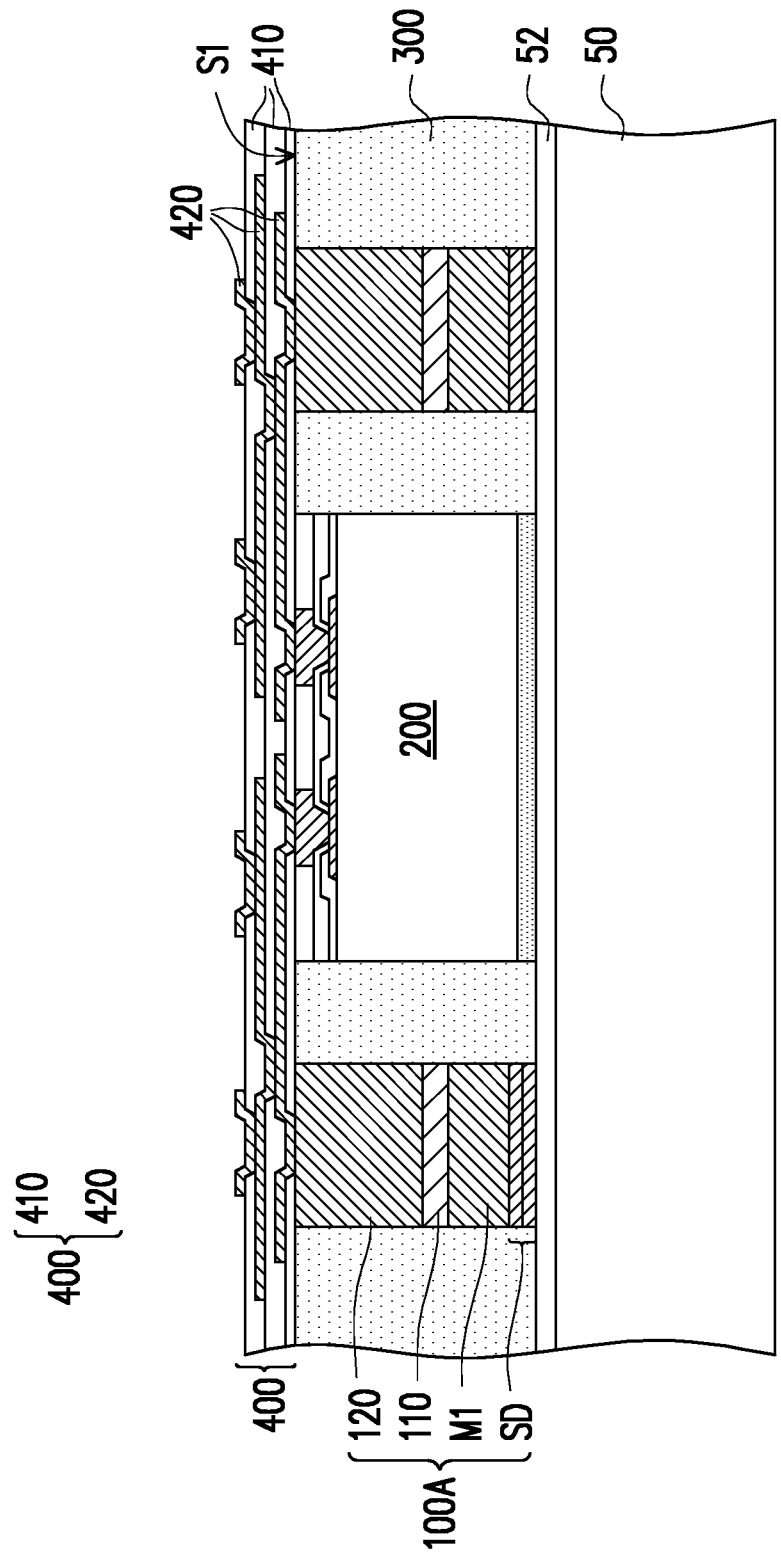
Figure 1I:
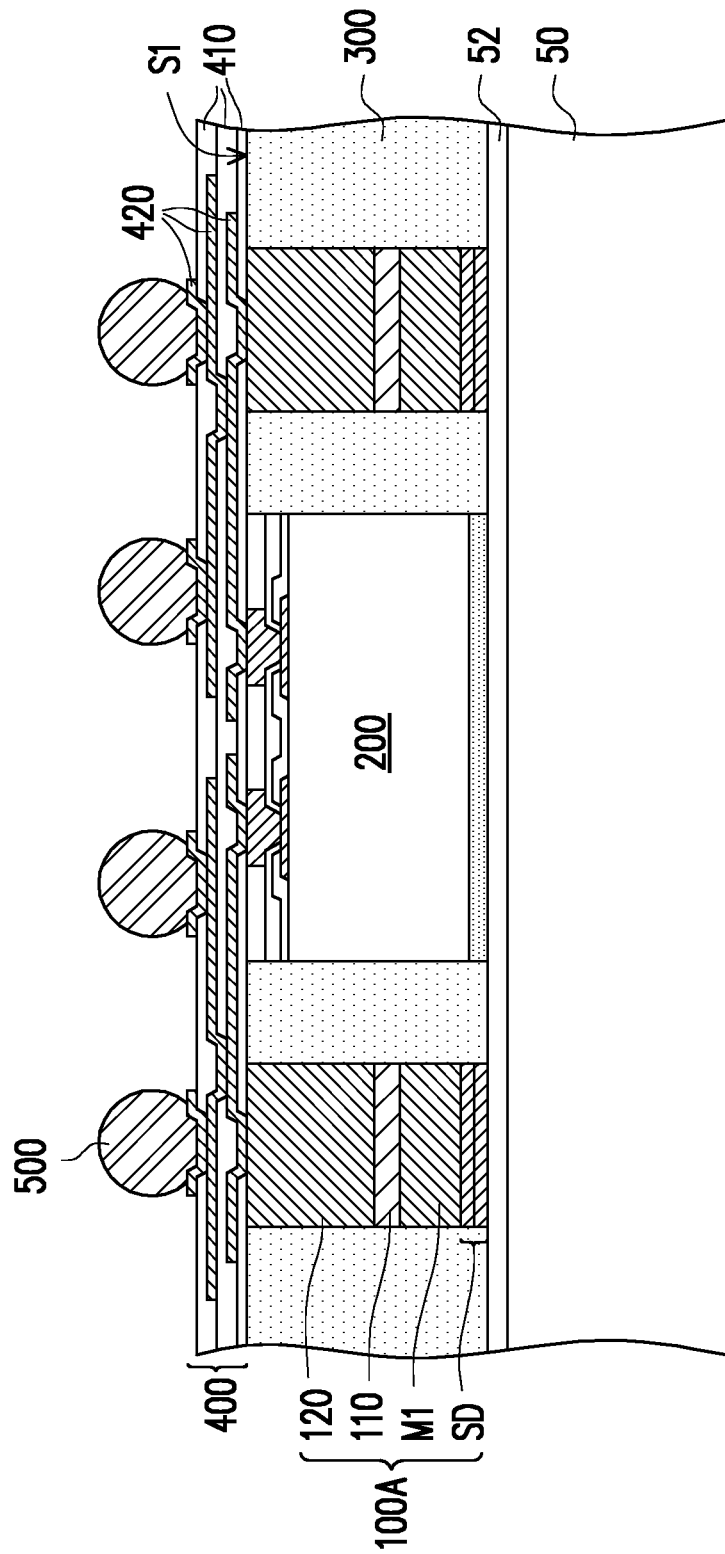
Figure 1J:
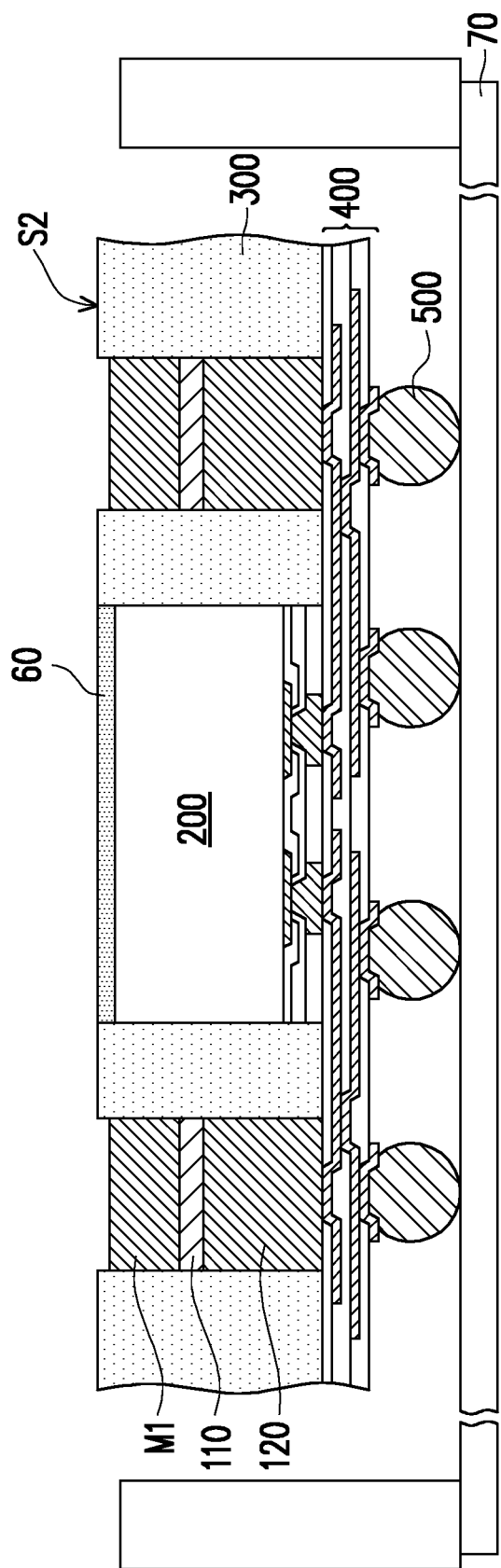
Figure 1K:
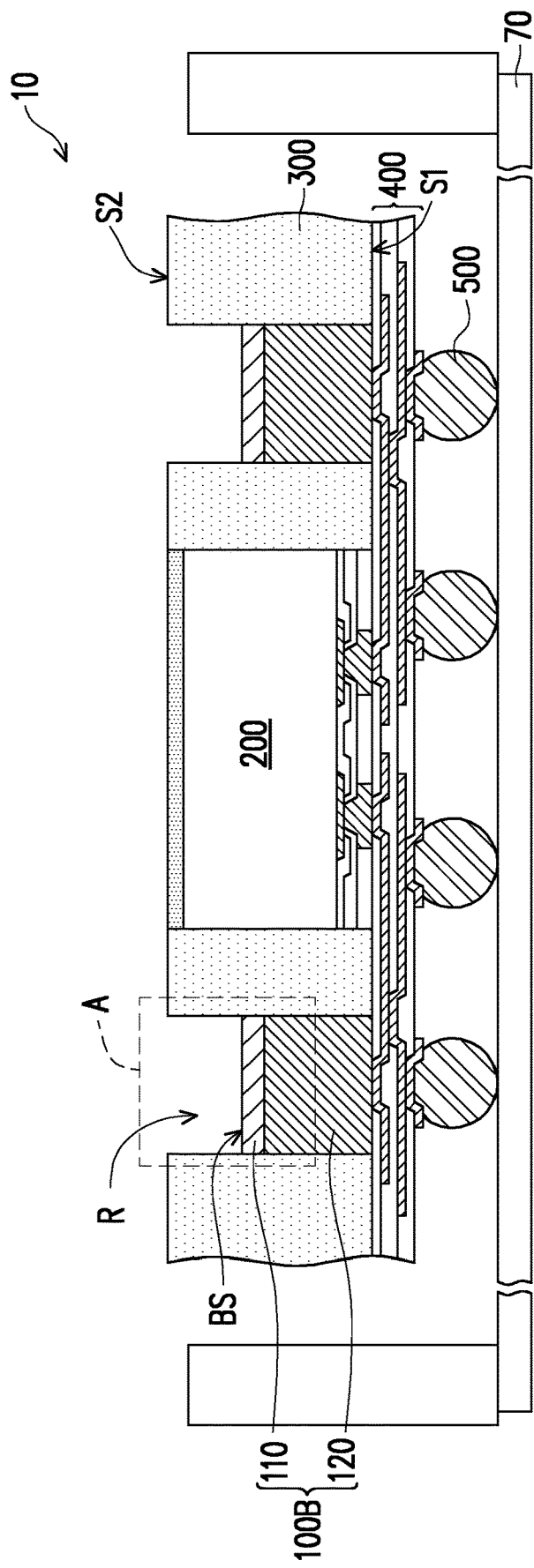
Figure 1L:
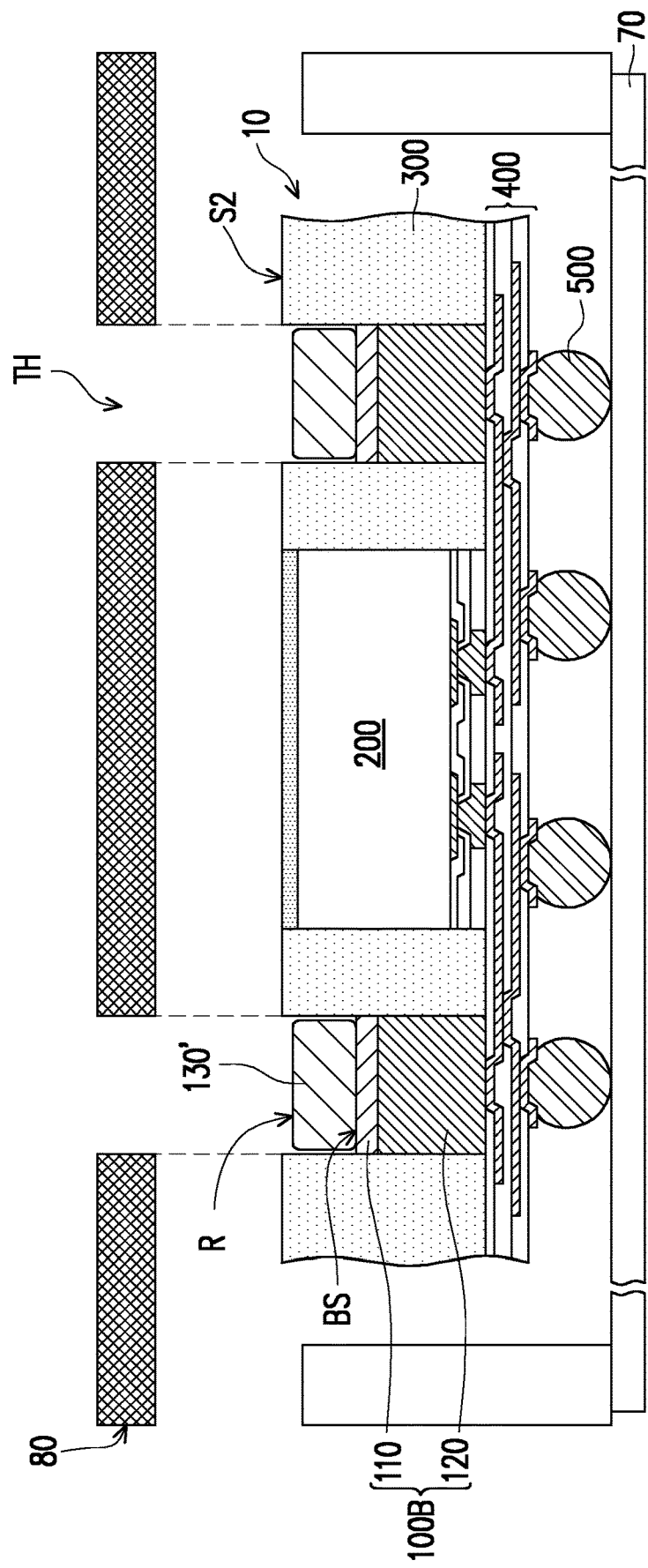
Figure 1M:
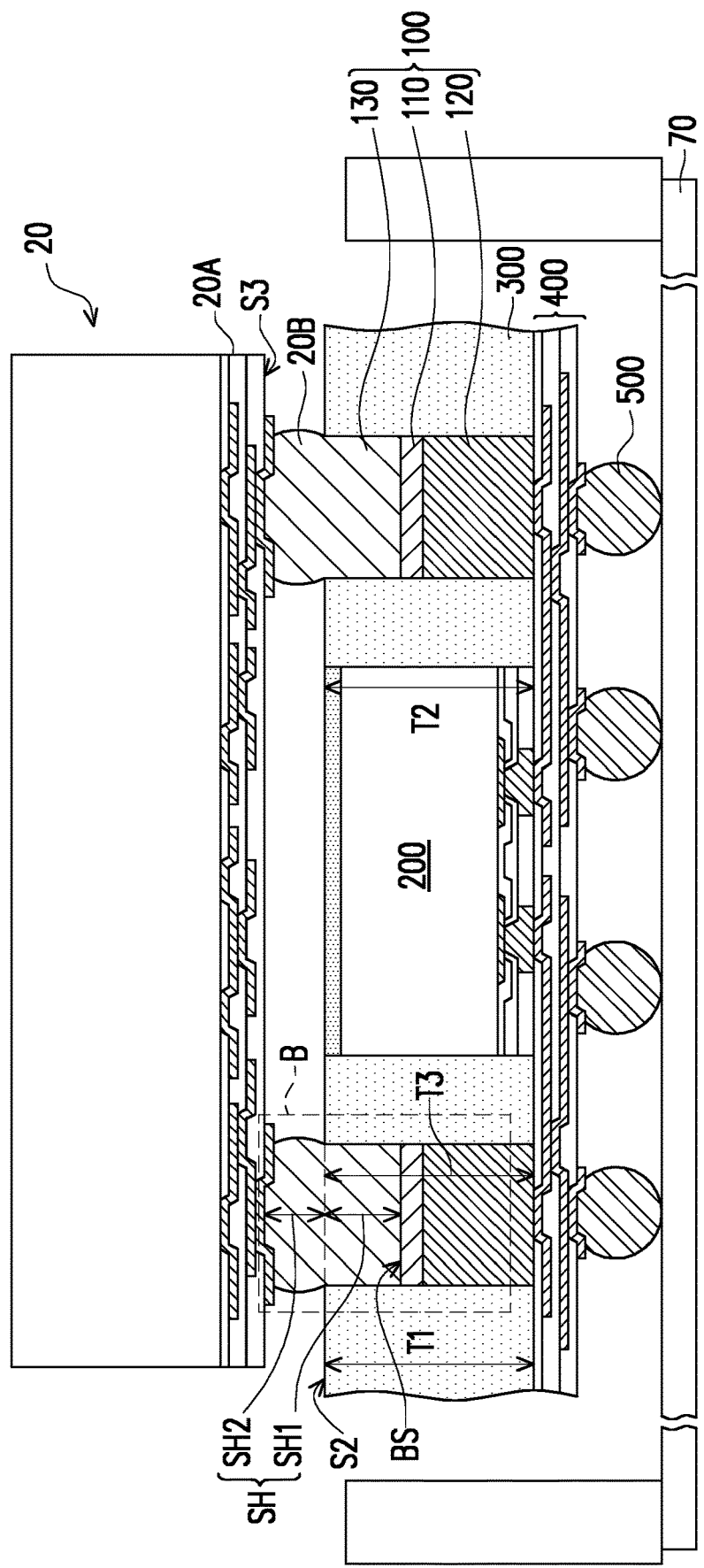
Figure 1N:
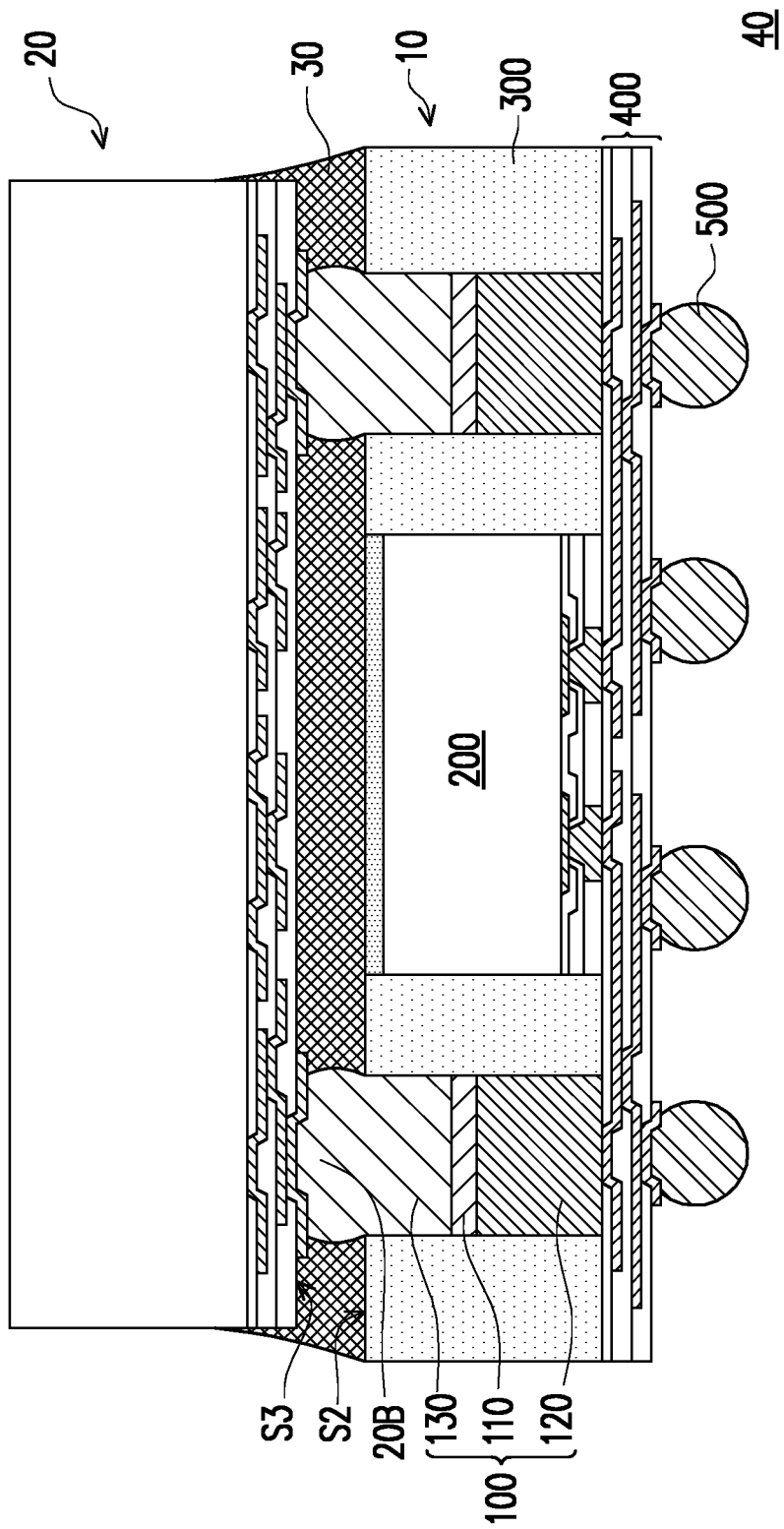

FIG. 1A to FIG. 1N are schematic cross sectional views of various stages in a manufacturing method of a package structure according to some exemplary embodiments of the disclosure. Referring to FIG. 1A, a seed material SD' may be formed over a temporary carrier 50 using physical vapor deposition (e.g., sputtering, plating, or evaporation, etc.), chemical vapor deposition, or other suitable process. In some embodiments, the seed material SD' is a conductive layer, which may be a single layer or a composite layer including several sub-layers formed of different materials. For example, the seed material SD' includes a titanium layer and a copper layer over the titanium layer. In some embodiments, the temporary carrier 50 may include any suitable material that can provide structural support during semiconductor processing. For example, a material of the temporary carrier 50 includes metal (e.g., steel), glass, ceramic, silicon (e.g., bulk silicon), combinations thereof, multi-layers thereof, or the like. In some embodiments, a release layer 52 may be formed on the temporary carrier 50 before forming the seed material SD'. The material of the release layer 52 may be any material suitable for bonding and de-bonding the temporary carrier 50 from the structure formed thereon. For example, the release layer 52 includes a layer of light-to-heat-conversion (LTHC) release coating and a layer of associated adhesive (such as a ultra-violet curable adhesive or a heat curable adhesive layer), or the like.

Referring to FIG. 1B to FIG. 1D, a metallic layer M1, a diffusion barrier layer 110, and a first conductor 120 may be sequentially formed over the seed material SD'. For example, with reference to FIG. 1B, a patterned photoresist layer PR may be formed over the seed material SD' once the seed material SD' has been formed. The patterned photoresist layer PR may include a dry film photoresist formed of a polymeric material. For example, the patterned photoresist layer PR is formed by depositing or laminating a photoresist material over the seed material SD', and then the photoresist material may be patterned to form the patterned photoresist layer PR using such as lithography (i.e. exposure and development processes), or other suitable techniques. In some embodiments, the patterned photoresist layer PR covers a portion of the seed material SD' and includes a plurality of openings OP exposing the other predetermined portion of the seed material SD'. In some embodiments, after forming the patterned photoresist layer PR, the metallic layer M1 is formed in the openings OP of the patterned photoresist layer PR to be in physical contact with the seed material SD' through deposition, or other suitable techniques. For example, the temporary carrier 50 with the seed material SD' and the patterned photoresist layer PR formed thereon may be immersed into a plating solution in a plating bath such that a metallic material is electroplated on the predetermined portion of the seed material SD' revealed by the openings OP of the patterned photoresist layer PR so as to form the metallic layer M1. The material of the metallic layer M1 may include copper, silver, gold, aluminum, alloys thereof, or other suitable conductive material. Electroplating may be performed at a lower current density, thereby forming the metallic layer M1 having a more uniform height. In some embodiments, for forming the metallic layer M1, electroplating is performed at current density of 1 ASD to 20 ASD approximately.

Continue to FIG. 1C, after forming the metallic layer M1, the diffusion barrier layer 110 may be deposited in the openings OP of the patterned photoresist layer PR to be in physical contact with the metallic layer M1. In some embodiments, the diffusion barrier layer 110 may have a good wettability with solder material at a reflow temperature. The diffusion barrier layer 110 may be formed of materials which can form a reliable intermetallic compound (IMC) interface in the subsequent process, and the detailed description will be described later accompany with the figures. In some embodiments, the diffusion barrier layer 110 may include materials which can wet to or dissolve into solder at a reflow temperature. The diffusion barrier layer 110 may be a single layer or a composite layer including multi-sublayers formed of different materials. For example, a material of the diffusion barrier layer 110 includes metal or metal alloy such as nickel, cobalt, gold, palladium, platinum, or alloys thereof, etc. In some embodiments, the diffusion barrier layer 110 may have a lower etching rate than the etching rate of copper in certain etching solution (e.g., $H_2SO_4+H_2O_2+H_2O$).

Continue to FIG. 1D, the first conductor 120 may be formed in the openings OP of the patterned photoresist layer PR to be in physical contact with the diffusion barrier layer 110. A material of the first conductor 120 may include metal or metal alloy such as copper, silver, gold, aluminum, or alloys thereof. In some embodiments, electrodeposition of the first conductor 120 is operated at a higher current density than electrodeposition operation of the metallic layer M1.

For example, electroplating of the first conductor 120 may be done at current density ranging from about 10 ASD to about 60 ASD.

Referring to FIG. 1E, after forming the first conductor 120, the patterned photoresist layer PR is removed by a stripping process (e.g., etching, or other suitable removal techniques). Thereafter, by using the structure (e.g., metallic layer M1/diffusion barrier layer 110/first conductor 120) formed on the seed material SD' as a hard mask, portions of the seed material SD' that are not covered by such structure are removed through an etching process, or other suitable techniques, so that the remaining portions of the seed material SD' underlying the metallic layer M1 are remained on the temporary carrier 50 to form a seed layer SD. In some embodiments, after removing portions of the seed material SD', the seed layer SD, metallic layer M1, diffusion barrier layer 110, first conductor 120 are collectively viewed as a multi-layered structure 100A. It should be noted that the number of the multi-layered structure 100A illustrated in FIG. 1E merely serves as an exemplary illustration, and the disclosure is not limited thereto.

Referring to FIG. 1F, in some embodiments, after forming the multi-layered structure 100A, a semiconductor die 200 may be provided and disposed on the temporary carrier 50. For example, the semiconductor die 200 is picked, placed on and attached onto the temporary carrier 50 through a die attachment material 60. The semiconductor die 200 may include digital die, analog die, or mixed signal die such as sensor die, or logic die (e.g. application-specific integrated circuit (ASIC), or System-on-Chip (SoC), etc.), but is not limited thereto. Note that, only one semiconductor die 200 shown in FIG. 1F is presented for illustrative purposes; however, it should be appreciated that the number of the semiconductor die 200 can be more than one depending on the product requirements, and the disclosure is not limited thereto. In some embodiments, the semiconductor die 200 placed on the temporary carrier 50 may be arranged in an array, and the plurality of multi-layered structures 100A may surround the semiconductor die 200. For example, the plurality of multi-layered structures 100A may be classified into groups, and the number of the semiconductor die 200 is corresponding to the number of the groups of the multi-layered structures 100A.

In some embodiments, the semiconductor die 200 is manufactured through a front end of line (FEOL) process, but is not limited thereto. For example, the semiconductor die 200 includes a semiconductor substrate 210, a plurality of connecting pads 220, a plurality of connecting pillars 230 and a protection layer 240. The semiconductor substrate 210 may be a silicon substrate including active components (e.g., diodes, transistors or the like) and passive components (e.g., resistors, capacitors, inductors or the like) formed therein. The connecting pads 220 may be made of aluminum, or alloys thereof, etc. In some embodiments, the connecting pillars 230 are respectively disposed on and electrically connected to the connecting pads 220, where the connecting pillars 230 physically contact the connecting pads 220. The connecting pillars 230 may include copper pillars, copper alloy pillars, or other suitable metal pillars. The connecting pillars 230 may include lead-based materials or lead-free materials with or without additional impurity formed on the top, but is not limited thereto.

In some embodiments, the protection layer 240 covers the connecting pads 220 and the connecting pillars 230. That is, the protection layer 240 prevents any possible damage(s) occurring on the surfaces of the connecting pillar 230 during the transfer of the semiconductor die 200. The protection layer 240 may be made of polybenzoxazole (PBO), polyimide (PI), or suitable polymers or inorganic materials. The numbers of the connecting pads 220 and the connecting pillars 230 can be selected based on demand and are not limited in the disclosure. It should be appreciated that the illustration of the semiconductor die 200 and other components throughout all figures is schematic and is not in scale. In some embodiments, the die attach material 60 may be bonded onto a rear surface of the semiconductor die 200 opposite to the side where the connecting pillars 230 are distributed. For example, the die attachment material 60 may be a die attached film (DAF), an adhesive bonding film (ABF), or the like. Other suitable adhesive materials compatible with semiconductor processing environments may be utilized as the die attachment material 60.

Continue to FIG. 1F, after disposing the semiconductor die 200, an insulating material 300' may be formed over the temporary carrier 50. In some embodiments, the insulating material 300' is a molding compound formed by a molding process. For example, the insulating material 300' is over-molded to encapsulate the multi-layered structures 100A, the semiconductor die 200 and the die attach material 60. In other words, the multi-layered structures 100A and the protection layer 240 of the semiconductor die 200 are not revealed and well protected by the insulating material 300'. The insulating material 300' may include epoxy resin or other suitable dielectric materials.

Referring to FIG. 1G, a thickness of the insulating material 300' may be reduced to reveal at least a portion of the first conductor 120 of the multi-layered structures 100A and a portion of the connecting pillars 230 of the semiconductor die 200. For example, the insulating material 300' is grinded until the top surfaces of the multi-layered structures 100A, the top surfaces of the connecting pillars 230, and the top surface of the protection layer 240 are exposed. In some embodiments, the insulating material 300' is grinded by a mechanical grinding process and/or a chemical mechanical polishing (CMP) process. In some embodiments, during the grinding process, not only the insulating material 300', but also portions of the protection layer 240 and/or the connecting pillars 230 and/or the first conductor 120 of the multi-layered structures 100A are slightly grinded. After reducing the thickness of the insulating material 300', an insulating encapsulant 300 having a first surface S1 and a second surface S2 opposite to the first surface S1 is formed over the temporary carrier 50. In some embodiments, the second surface S2 of the insulating encapsulant 300 facing toward the temporary carrier 50 is in contact with the release layer 52. As shown in FIG. 1G, the insulating encapsulant 300 laterally encapsulates the sidewall of the semiconductor die 200 and the sidewall of the multi-layered structures 100A, and the insulating encapsulant 300 is penetrated by the multi-layered structures 100A. In some embodiments, the top surfaces of the multi-layered structures 100A, the first surface S1 of the insulating encapsulant 300 is substantially coplanar with the top surfaces of the connecting pillars 230 of the semiconductor die 200.

In some alternative embodiments, the multi-layered structures 100A may be formed after forming the insulating material 300'. For example, the semiconductor die 200 is first attached on the temporary carrier 50 through the die attach material 60, and then the insulating material 300' is formed over the temporary carrier 50 to encapsulate the semiconductor die 200 and the die attach material 60. Next, a drilling process (e.g., a laser drilling, a mechanical drilling, or other suitable process) may be performed on the insulating material 300' to form holes in the insulating material 300'. Subsequently, the seed layer SD, the metallic layer M1, the diffusion barrier layer 110, and the first conductor 120 may be sequentially filled in the holes of the insulating material 300'. The insulating material 300', the first conductor 120 and the semiconductor die 200 may be further planarized to form the insulating encapsulant 300 and the multi-layered structures 100A.

Referring to FIG. 1H, after forming the insulating encapsulant 300, a redistribution structure 400 may be formed over the insulating encapsulant 300, the semiconductor die 200 and the first conductor 120 of the multi-layered structure 100A. For example, the redistribution structure 400 electrically connected to the connecting pillars 230 of the semiconductor die 200 and the first conductor 120 is formed over the top surfaces of the first conductor 120, the first surface S1 of the insulating encapsulant 300, the top surfaces of the connecting pillars 230, and the top surface of the protection layer 240. In some embodiments, since the redistribution structure 400 connected to the semiconductor die 200 reroutes the electrical signal of the semiconductor die 200 and expands wider than the size of the semiconductor die 200, the redistribution structure 400 may be referred to as a fan-out redistribution structure.

In some embodiments, the redistribution structure 400 includes a plurality of patterned dielectric layers 410 and a plurality of patterned conductive layers 420 stacked alternately, and the patterned conductive layers 420 are electrically connected to the connecting pillars 230 of the semiconductor die 200 and the multi-layered structure 100A embedded in the insulating encapsulant 300. The top surfaces of the connecting pillars 230 and the top surfaces of the first conductor 120 of the multi-layered structure 100A are partially covered by the bottommost patterned dielectric layers 410. In some embodiments, the outermost patterned conductive layer 420 may include a plurality of pads, and these pads may serve as under-ball metallurgy (UBM) pads for a subsequent ball mounting process. It is noted that the number of the UBM pads is not limited in this disclosure.

Referring to FIG. 1I, a plurality of conductive terminals 500 may be formed on the redistribution structure 400. For example, the conductive terminals 500 are disposed on the exposed top surface of the outermost patterned conductive layer 420. In some embodiments, the conductive terminals 500 are solder balls or ball grid array (BGA) placed on the UBM pads of the outermost patterned conductive layer 420. A reflow process may be optionally performed for enhancement of the adhesion between the conductive terminals 500 and the redistribution structure 400. In some embodiments, through the redistribution structure 400, some of the conductive terminals 500 are electrically connected to the semiconductor die 200 and the multi-layered structure 100A. In some other embodiments, a passive semiconductor component (not shown) may be mounted onto the outermost patterned dielectric layer 410 to and electrically connected to the outermost patterned conductive layer 420 surrounding by the conductive terminals 500 according to product requirements.

Referring to FIG. 1J, in some embodiments, after forming the conductive terminals 500, the temporary carrier 50 and the release layer 52 are removed to expose the second surface S2 of the insulating encapsulant 300. For example, the temporary carrier 50 is detached from the insulating encapsulant 300, the multi-layered structure 100A, and the die attach material 60 through a de-bonding process. In some embodiments, the external energy such as UV laser, visible light or heat, may be applied to the release layer 52 so that the temporary carrier 50 can be removed. In some embodiments, when de-bonding the temporary carrier 50, the seed layer SD of the multi-layered structure 100A may be removed along with the release layer 52 to expose the metallic layer M1. In some embodiments, the structure may be flipped (e.g., turned upside down) and placed on a holder 70 for performing subsequent processes formed on the second surface S2 of the insulating encapsulant 300. For example, after the flipping process, the conductive terminals 500 are disposed on or attached to the holder 70. Depending on the process design requirement, the flipping process may be performed before or after the removal process of the temporary carrier 50.

Figure 2A:
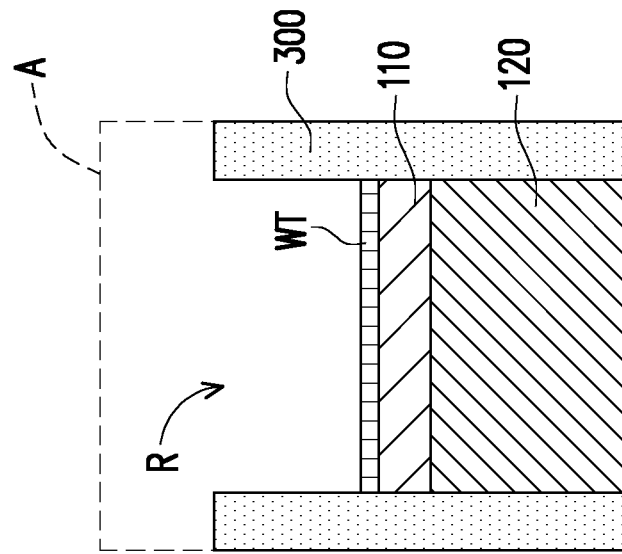
FIG. 2A is an enlarged, schematic cross-sectional view of the dashed box A depicted in FIG. 1K according to some exemplary embodiments of the disclosure.
Figure 2B:
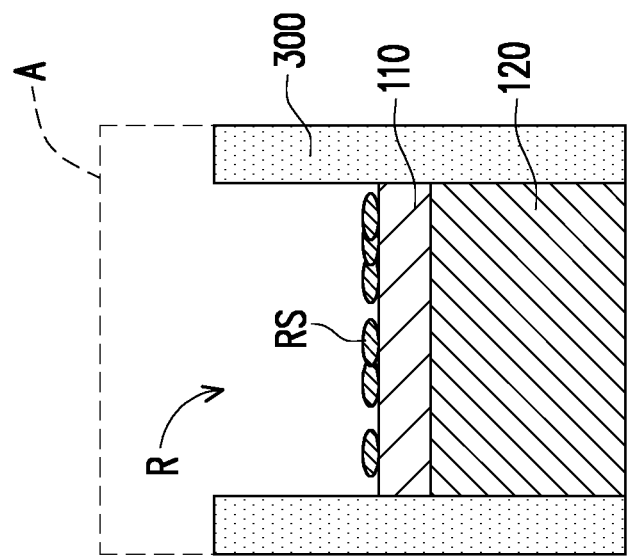
FIG. 2B is an enlarged, schematic cross-sectional view of the dashed box A depicted in FIG. 1K according to some exemplary embodiments of the disclosure.

FIG. 2A and FIG. 2B are enlarged, schematic cross-sectional views of the dashed box A depicted in FIG. 1K according to some different exemplary embodiments of the disclosure. Referring to FIG. 2A, FIG. 2B and FIG. 1K, the metallic layer M1 of the multi-layered structure 100A may be removed to form a recess R in the insulating encapsulant 300. In some embodiments, after removing the metallic layer M1, the diffusion barrier layer 110 may be exposed by the recess R. For example, the metallic layer M1 may be etched back until the diffusion barrier layer 110 is exposed so that the diffusion barrier layer 110 may be viewed as an etching stop layer. In some embodiments, after removing the metallic layer M1, the remaining portions of the structure (e.g., including the diffusion barrier layer 110 and the first conductor 120) may be collectively viewed as a multi-layered conductor 100B. In some embodiments, a barrier surface BS of the multi-layered conductor 100B is exposed by the recess R. For example, the barrier surface BS is located between the first surface 51 and the second surface S2 of the insulating encapsulant 300. The barrier surface BS may be substantially parallel to the first surface 51 and/or the second surface S2 of the insulating encapsulant 300. In some embodiments, after removing the metallic layer M1, a surface cleaning process may be performed to remove residuals and/or by-products undesirably existing on the barrier surface BS inside the recess R so as to insure that the barrier surface BS upon which further conductive materials are formed, are clean, and that the resistance may be thereby minimized. In some embodiments, the structure provided on the holder 70 illustrated in FIG. 1K is viewed as a first semiconductor package 10.

In some other embodiments, after removing the metallic layer M1, a portion of metallic-containing residues RS of the metallic layer M1 may be remained on the diffusion barrier layer 110 as shown in FIG. 2A. In some embodiments, the metallic-containing residues RS may be copper-containing residues. The metallic-containing residues RS may be a thin layer covering the diffusion barrier layer 110. For example, a maximum thickness of the metallic-containing residues RS of the metallic layer M1 ranges from 0.5 μm to 5 μm approximately. In some embodiments, after removing the metallic layer M1 and performing the surface cleaning process, the diffusion barrier layer 110 is exposed, where the diffusion barrier layer 110 may include multi-sublayers, and the outermost sublayer opposite to the first conductor 120 may be made of a material with good wettability (e.g., gold). In such embodiments, the surface of the outermost sublayer of the diffusion barrier layer 110 is viewed as the barrier surface BS. In other embodiments, after removing the metallic layer M1, the diffusion barrier layer 110 is exposed, and then a wetting layer WT may be formed on top of the diffusion barrier layer 110 inside the recess R to be in physical contact with the diffusion barrier layer 110 for better wettability as shown in FIG. 2B. In such embodiments, the surface of the wetting layer WT is viewed as the barrier surface BS. For example, a thickness of the wetting layer WT ranges from about 0.01 μm to about 1 μm.

Referring to FIG. 1L, a conductive material 130' may be formed on the barrier surface BS of the multi-layered conductor 100B inside the recess R using a printing process, a plating process, or other suitable techniques. For example, a mask 80 having a plurality of through holes TH is placed over the second surface S2 of the insulating encapsulant 300. The through holes TH of the mask 80 may be substantially aligned with the recess R of the first semiconductor package 10. Subsequently, the conductive material 130' may be applied onto the barrier surface BS of the multi-layered conductor 100B as exposed through the mask 80. In some embodiments, the conductive material 130' is different from a material of the first conductor 120. The conductive material 130' may be solder paste and/or flux including an alloy of silver, tin, zinc, copper, antimony, cadmium, indium, bismuth, or combinations thereof, etc., or other suitable metallic materials. In some embodiments, the recess R may not be filled by the conductive material 130' at this stage.

Referring to FIG. 1M, a second semiconductor package 20 is provided and mounted on the first semiconductor package 10 so that the first semiconductor package 10 and the second semiconductor package 20 are electrically connected. For example, the second semiconductor package 20 may be a package with at least one semiconductor die (not shown) that has a majority of active devices configured for a memory storage array function, or execute processor functions, etc. The semiconductor die in the second semiconductor package 20 can be in the form of memory chips (e.g., DRAM chips), application-specific integrated circuit (ASIC) chips, or various combinations chips with different functions. In some embodiments, the second semiconductor package 20 include a redistribution circuitry layer 20A disposed on a front side S3 of the second semiconductor package 20, and a plurality of conductive features connected to the redistribution circuitry layer 20A. The semiconductor die in the second semiconductor package 20 may be electrically coupled to the conductive features through the redistribution circuitry layer 20A. After disposing the second semiconductor package 20 on the first semiconductor package 10, the front side S3 of the second semiconductor package 20 may face towards the first semiconductor package 10. In some embodiments, the conductive features of the second semiconductor package 20 may be substantially aligned with the recess R of the first semiconductor package 10 for a bonding process. For example, a material of the conductive features of the second semiconductor package 20 includes solder.

Continue to FIG. 1M, the conductive features of the second semiconductor package 20 and the conductive material 130' in the recess R are bonded to each other. For example, a thermal treating process may be performed onto the conductive features of the second semiconductor package 20 and/or the conductive material 130'. In some embodiments, the conductive features of the second semiconductor package 20 and/or the conductive material 130' may be subjected to a reflow process, and then result in a deformation of the conductive features into conductive joints 20B of the second semiconductor package 20 and a deformation of the conductive material 130' into second conductors 130 in the recess R of the first semiconductor package 10. The reflow process may be performed with or without an optional flux step. Flux is a chemical cleaning agent which may prevent oxidation of solder during the reflow process, for example, after the flux step is completed, the flux is then cleaned from the space between the second semiconductor package 20 and the first semiconductor package 10.

In some embodiments, after the bonding process, a portion of the conductive material (e.g., solder) laterally encapsulated by the insulating encapsulant 300 may be viewed as the second conductor 130 of the first semiconductor package 10, and the other portion of the conductive material (e.g., solder) overlying the second conductor 130 and exposed by the insulating encapsulant 300 at this stage may be viewed as the conductive joints 20B of the second semiconductor package 20. In other words, the first semiconductor package 10 may include the second conductor 130 disposed on the first conductor 120 and laterally encapsulated by the insulating encapsulant 300, and the diffusion barrier layer 110 is sandwiched between the first conductor 120 and the second conductor 130. The second conductor 130 and the conductive joints 20B are made of the same material. For example, the second conductor 130 may be thinner than the multi-layered conductor 100B (e.g., including the diffusion barrier layer 110 and the first conductor 120). In some embodiments, the first conductor 120, the diffusion barrier layer 110 and the second conductor 130 may be collectively represented as a conductive structure 100. In some embodiments, the first conductor 120, the diffusion barrier layer 110 and the second conductor 130 are made of different materials. In some other embodiments, the conductive structure 100, which is electrically coupled to the semiconductor die 200 through the redistribution structure 400 and encapsulated by the insulating encapsulant 300, may be referred to as through insulating vias (TIVs) or through integrated fan-out (InFO) vias. The exemplary first semiconductor package 10 such as described above may be referred to as an integrated fan-out (InFO) semiconductor package.

In some embodiments, since the second conductors 130 and the conductive joints 20B are made of the same or similar material and formed during the same process, the better connection between the first semiconductor package 10 and the second semiconductor package 20 is achieved, thereby enhancing the reliability of the device. In some embodiments, since the total volume of solder material does not change during the reflow process, the second conductor 130 may be filled in the recess R, and the corresponding conductive joint 20B formed by the rest portions of solder material may be extruded wider than the width of the recess R overlying the second conductor 130 as shown in the enlarged view of FIG. 3. In some embodiments, due to the material characteristic of solder, the conductive joint 20B may have a smooth-rounded sidewall profile.

Continue to FIG. 1M, in some embodiments, after the bonding process, the second conductor 130 combining with the corresponding conductive joint 20B has a total standoff height SH. For example, the total standoff height SH is measured from the barrier surface BS inside the first semiconductor package 10 to the front side S3 of the second semiconductor package 20. That is, the total standoff height SH includes a first standoff height SH1 of the second conductor 130 and a second standoff height SH2 of the corresponding conductive joint 20B. As the demand for shrinking electronic devices has grown, a reduced total standoff height SH may meet the miniaturization requirement. For example, a ratio of the first standoff height SH1 to the second standoff height SH2 ranges from about 0.4 to about 1.5. Generally, if solder joints are too thin (i.e. less standoff height), the connection between semiconductor packages is less robust and more prone to crack; however, if solder joints are thick (i.e. more standoff height), the entire thickness of the semiconductor package is increased. Therefore, by forming the second conductor 130 in the recess R of the first semiconductor package 10, the second conductor 130 combining with the corresponding conductive joint 20B can have the total standoff height SH enough to provide good connection between semiconductor packages, thereby achieving reliability without compromising the entire thickness of the first semiconductor package 10 and the second semiconductor package 20.

That is, the total thickness of the first semiconductor package 10 and the second semiconductor package 20 may be reduced by shortening the gap between the front side S3 of the second semiconductor package 20 and the second surface S2 of the insulating encapsulant 300 of the first semiconductor package 10, thereby meeting the miniaturization requirement. In some embodiments, a thickness T1 of the insulating encapsulant 300 is substantially equal to a total thickness T2 of the semiconductor die 200 and the die attach material 60. In some embodiments, the thickness T1 of the insulating encapsulant 300 is substantially equal to a thickness T3 of the conductive structure 100. For example, the diffusion barrier layer 110 may have a thickness of about 0.5 μm to 5 μm. A ratio of the thickness of the diffusion barrier layer 110 to the thickness T1 of the insulating encapsulant 300 may be in a range of about 0.2% to 4%. In some embodiments, a thickness of the first conductor 120 may be greater than that of the second conductor 130. The first conductor 120 may be substantially thicker to provide a lower electrical resistance of a formed package. For example, a ratio of a thickness of the first conductor 120 to the first standoff height SH1 (e.g., thickness) of the second conductor 130 ranges from about 55% to about 175%, although this ratio will vary and will scale with semiconductor processes. It should be appreciated that the thickness of the first conductor 120 and the first standoff height SH1 will vary with device size or process technology, and the height or thickness of these first conductors 120 is not restricted.

Figure 3:
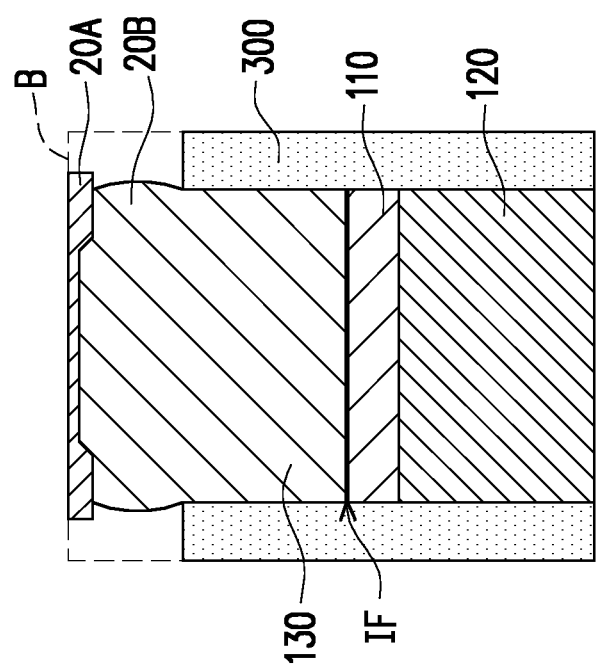
FIG. 3 is an enlarged, schematic cross-sectional view of the dashed box B depicted in FIG. 1M according to some exemplary embodiments of the disclosure.

FIG. 3 is an enlarged, schematic cross-sectional view of the dashed box B depicted in FIG. 1M according to some exemplary embodiments of the disclosure. Referring to FIG. 3 and FIG. 1M, after the thermal treating process, an IMC interface IF may be formed between the second conductor 130 and the diffusion barrier layer 110. In some embodiments, the diffusion barrier layer 110 may block IMC formation between the conductive structure 100 and the insulating encapsulant 300. That is, without the diffusion barrier layer 110, the solder material may react with the first conductor 120 to form an undesired IMC between the first conductor 120 and the insulating encapsulant 300 when forming the second conductor 130, which may result in delamination issue between the conductive structure 100 and the insulating encapsulant 300. Therefore, due to the diffusion barrier layer 110 the delamination issue causing by IMC formation between the conductive structure 100 and the insulating encapsulant 300 may be eliminated.

In some embodiments in which the metallic-containing residues RS are remained on the diffusion barrier layer 110, the portion of metallic-containing residues RS reacts with materials of the second conductor 130 and the diffusion barrier layer 110 to form the IMC interface IF between the second conductor 130 and the diffusion barrier layer 110. The presence of copper may affect the adhesion among the layers in the conductive structure 100. For example, with the metallic-containing residues RS (e.g., copper-containing residues), the diffusion barrier layer 110 (e.g., including nickel) and the second conductor 130 (e.g., including Sn-solder). In some embodiments, the diffusion barrier layer 110 of the conductive structure 100 may block copper diffusion from the first conductor 120 to the second conductor 130. Without the diffusion barrier layer 110, an undesired thicker IMC may form at the interface between the first conductor 120 to the second conductor 130, and such thicker IMC weakens the strength of the conductive structure 100 and results in a poor adhesion. In other words, due to the diffusion barrier layer 110, the IMC interface IF formed among the conductive structure 100 may provide a good interfacial adhesion, thereby improving the reliability. In some alternative embodiments, some materials with good wettability (e.g., gold) is on top of the diffusion barrier layer 110. For example, the wetting layer WT is formed on the diffusion barrier layer 110 or the diffusion barrier layer 110 includes the outermost sublayer made of materials with good wettability. In certain embodiments, during the thermal treating process, such materials with good wettability may diffuse into the solder material.

Referring to FIG. 1N, in some embodiments, after mounting the second semiconductor package 20 onto the first semiconductor package 10, an underfill layer 30 is formed in the gap between the first semiconductor package 10 and the second semiconductor package 20. A singulation (dicing) process may be performed along the cutting line (not shown) to form a plurality of individual and separate electronic devices 40. In some embodiments, the singulation (dicing) process includes mechanical sawing or laser cutting. Up to here, the manufacture of the electronic device 40 is completed.

In some embodiments, an underfill material is dispensed or injected between the front side S3 of the second semiconductor package 20 and the second surface S2 of the insulating encapsulant 300. Subsequently, the underfill material may be cured to form the underfill layer 30 encapsulating the conductive joints 20B of the second semiconductor package 20. A material of the underfill layer 30 and that of the insulating encapsulant 300 may be the same or different and the disclosure is not limited thereto. In some embodiments, the underfill layer 30 may cover both of the conductive joints 20B and the redistribution circuitry layer 20A of the second semiconductor package 20. For example, the underfill layer 30 may cover the front side S3 and also laterally cover a portion of the sidewall of the second semiconductor package 20 for enhancing the reliability of the electronic device 40.

According to some embodiments, a device includes a semiconductor die and a conductive structure disposed side-by-side and spaced apart from each other through an insulating encapsulant. The conductive structure includes a first conductor laterally covered by the insulating encapsulant, and a second conductor disposed over and separating from the first conductor. The second conductor includes a first portion laterally covered by the insulating encapsulant and a second portion protruded from the insulating encapsulant, where a ratio of a first standoff height of the first portion and a second standoff height of the second portion ranges from about 0.4 to about 1.5.

According to some embodiments, an integrated fan-out (InFO) package includes a semiconductor die, a conductive structure electrically coupled to the semiconductor die, an insulating encapsulant, and a redistribution structure disposed on the insulating encapsulant, the semiconductor die, and the conductive structure. The conductive structure a conductive pillar and a solder joint disposed over the conductive pillar, the solder joint includes a pillar portion and a rounded portion on the pillar portion, where a ratio of a first standoff height of the pillar portion and a second standoff height of the rounded portion ranges from about 0.4 to about 1.5. The insulating encapsulant covers sidewalls of the semiconductor die, the conductive pillar, and the pillar portion of the solder joint. The redistribution structure is electrically connected to the semiconductor die and the first conductor of the conductive structure.

According to some embodiments, a package-on-package (PoP) structure includes a lower package and an upper package stacked upon and electrically connected to the lower package. The lower package includes a semiconductor die, a conductive structure electrically coupled to the semiconductor die, and an insulating encapsulant. The conductive structure includes a vertical-sidewall portion including a first material segment and a second material segment disposed over the first material segment; and a curved-sidewall portion overlying the vertical-sidewall portion and continuously connected to the second material segment, where a ratio of a first standoff height of the second material segment and a second standoff height of the curved-sidewall portion ranges from about 0.4 to about 1.5. The insulating encapsulant laterally covers the semiconductor die and the vertical-sidewall portion of the conductive structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A device, comprising:
a semiconductor die and a conductive structure disposed side-by-side and spaced apart from each other through an insulating encapsulant, the conductive structure comprising:
a first conductor laterally covered by the insulating encapsulant;
a second conductor disposed over and separating from the first conductor, the second conductor comprising a first portion laterally covered by the insulating encapsulant and a second portion protruded from the insulating encapsulant, wherein a ratio of a first standoff height of the first portion and a second standoff height of the second portion ranges from about 0.4 to about 1.5; and
a diffusion barrier layer interposed between the first conductor and the second conductor.

2. The device according to claim 1, wherein a thickness of the diffusion barrier layer is in a range of about 0.5 μm to about 5 μm.

3. The device according to claim 1, wherein the conductive structure further comprises:
an intermetallic compound interface disposed between the second conductor and the diffusion barrier layer.

4. The device according to claim 1, wherein the first conductor and the second conductor are of different materials, and the second conductor is of a solder material.

5. The device according to claim 1, wherein the first portion of the second conductor comprises a substantially vertical sidewall, and the second portion of the second conductor comprises a curved sidewall.

6. The device according to claim 1, further comprising:
a package component stacked over the semiconductor die and electrically coupled to the semiconductor die through the conductive structure, wherein the package component is in physical contact with the second portion of the second conductor.

7. The device according to claim 6, further comprising:
an underfill filling a gap between the package component and the semiconductor die and surrounding the second portion of the second conductor.

8. The device according to claim 1, further comprising:
a redistribution structure disposed on the semiconductor die, the insulating encapsulant, and the first conductor of the conductive structure, wherein the redistribution structure is electrically connected to the semiconductor die and the conductive structure.

9. The device according to claim 8, wherein the first conductor of the conductive structure comprises a copper-containing layer physically connected to the redistribution structure.

10. The device according to claim 1, wherein a maximum width of the first portion of the second conductor is less than a maximum width of the second portion of the second conductor.

11. An integrated fan-out (InFO) package, comprising:
a semiconductor die;
a conductive structure electrically coupled to the semiconductor die and comprising:
a conductive pillar and a solder joint disposed over the conductive pillar, the solder joint comprising a pillar portion and a rounded portion on the pillar portion, wherein a ratio of a first standoff height of the pillar portion and a second standoff height of the rounded portion ranges from about 0.4 to about 1.5; and
a diffusion barrier layer interposed between the conductive pillar and the pillar portion of the solder joint;
an insulating encapsulant covering sidewalls of the semiconductor die, the conductive pillar, and the pillar portion of the solder joint; and
a redistribution structure disposed on the insulating encapsulant, the semiconductor die, and the conductive structure, and the redistribution structure being electrically connected to the semiconductor die and the first conductor-conductive pillar of the conductive structure.

12. The InFO package according to claim 11, wherein a thickness of the diffusion barrier layer is in a range of about 0.5 μm to about 5 μm.

13. The InFO package according to claim 11, wherein the conductive structure further comprises:
an intermetallic compound interface disposed between the pillar portion of the solder joint and the diffusion barrier layer.

14. The InFO package according to claim 11, wherein the semiconductor die comprises conductive bumps distributed over a semiconductor substrate, the conductive bumps are in physical contact with the redistribution structure.

15. The InFO package according to claim 11, wherein surfaces of the semiconductor die, the conductive pillar, and the insulating encapsulant are substantially leveled with one another.

16. The InFO package according to claim 11, wherein a maximum width of the rounded portion is greater than a maximum width of the pillar portion.

17. A package-on-package (POP) structure, comprising:
a lower package comprising:
a semiconductor die;
a conductive structure electrically coupled to the semiconductor die and comprising:
a vertical-sidewall portion comprising a first material segment and a second material segment disposed over the first material segment, and a diffusion barrier layer interposed between the first material segment and the second material segment; and
a curved-sidewall portion overlying the vertical-sidewall portion and continuously connected to the second material segment, wherein a ratio of a first standoff height of the second material segment and a second standoff height of the curved-sidewall portion ranges from about 0.4 to about 1.5;
an insulating encapsulant laterally covering the semiconductor die and the vertical-sidewall portion of the conductive structure; and
an upper package stacked upon and electrically connected to the lower package.

18. The POP according to claim 17, wherein the vertical-sidewall portion of the conductive structure further comprises:
an intermetallic compound interface disposed between the first material segment and the diffusion barrier layer.

19. The POP according to claim 17, wherein the upper package is in physical contact with the curved-sidewall portion of the conductive structure.

20. The POP according to claim 17, wherein the curved-sidewall portion and the second material segment of the vertical-sidewall portion are made of a solder material.

* * * * *